United States Patent [19]

Koch

[11] 4,333,228

[45] Jun. 8, 1982

[54] METHOD FOR PRODUCING A SUPER-CONDUCTIVE COIL AND COIL PRODUCED IN ACCORDANCE WITH THIS METHOD

[75] Inventor: Alfred Koch, Bremgarten, Switzerland

[73] Assignee: BBC Brown, Boveri & Company, Limited, Baden, Switzerland

[21] Appl. No.: 87,342

[22] Filed: Oct. 23, 1979

[30] Foreign Application Priority Data

Dec. 22, 1978 [CH] Switzerland ....................... 13071/78

[51] Int. Cl.[3] ............................................ H01L 39/24

[52] U.S. Cl. .................................... 29/599; 174/15 S; 335/216

[58] Field of Search .......................... 335/216; 29/599; 174/15 S, 126 S, 128 S

[56] References Cited

U.S. PATENT DOCUMENTS 4,079,187 3/1978 Fillunger et al. .................. 335/216

*Primary Examiner*—Harold Broome

*Attorney, Agent, or Firm*—Oblon, Fisher, Spivak, McClelland & Maier

[57] ABSTRACT

A method for producing a super-conductive coil and a coil produced in accordance with the method, wherein the coil is formed of a coil conductor containing a carrier consisting of a stabilizing material and a U-shaped steel sheath. In the carrier, a main duct is arranged in which at least one super-conductor wire or one super-conductor cable is embedded by means of a joining material. The super-conductor wire or the super-conductor cable is introduced into the main duct. Thereafter, the carrier is formed into the form of a coil and then the main duct with the super-conductor wire or the super-conductor cable is filled with the thermally and electrically conductive joining material.

5 Claims, 5 Drawing Figures

METHOD FOR PRODUCING A SUPER-CONDUCTIVE COIL AND COIL PRODUCED IN ACCORDANCE WITH THIS METHOD

BACKGROUND OF THE INVENTION

1. Field of the Invention

The invention relates to a method for producing a super-conductive coil comprising a coil conductor containing a carrier which essentially consists of a stabilizing material and in which a main duct is arranged in which at least one super-conductor wire or one super-conductor cable is attached with a joining material, and a coil produced in accordance with this method.

2. Description of the Prior Art

The production of high-intensity magnetic fields with field strengths of over 100 tesla, by electromagnetic coils of super-conductive material is of great importance and is used for example in fusion engineering.

From Swiss Pat. No. 594,961 a super-conductor is known which consists step-by-step of single conductors and at least two cabling stages of the part-cables. An end cable consisting of part-cables is embedded into a copper section conductor open on one side or consisting of two parts, and sealed with solder. In the copper section conductor a cooling channel is arranged through which helium flows.

For producing super-conductors suited for very high electric currents the super-conductive material used is an intermetallic A 15 compound, for example $Nb_3Sn$, $V_3Ga$ or $V_3Si$. These materials have the disadvantage, however, of being very brittle after a reaction annealing, producing the A15 bonding, has been completed and can be bent and stretched only by small amounts if the super-conductive properties thereof are not to be impaired.

SUMMARY OF THE INVENTION

Accordingly, one object of this invention is to provide a novel method for producing a super-conductive coil, and a coil produced in accordance with the method, in which high mechanical stresses or strains, leading to a loss of the super-conductor properties under additional loading by the forces of a field, are not already built into the super-conductor wires during the production process.

This and other objects are achieved according to the present invention by providing a novel method for producing a super-conductive coil formed of a coil conductor comprising a carrier which essentially consists of a stabilizing material and in which a main duct is arranged in which at least one super-conductor wire or one super-conductor cable is embedded by means of a joining material. It is further characterized in that the super-conductor wire or the super-conductor cable, or a wire or cable which can be made into such by means of reaction annealing, is inserted loosely into the main duct, after which the carrier is brought into the shape of a coil. Furthermore the main duct with the super-conductor wire or the super-conductor cable is filled with the joining material, the reaction annealing taking place before the filling of the main duct where reaction-annealed wires or cables are used.

The method according to the invention assures that super-conductor wires or cables, whether or not previously reaction annealed, are not stretched excessively in the production of the coil conductor and in the winding of the coil and that, therefore, the super-conductive condition is retained even with relatively high current intensities and the field strengths associated therewith. The method of the invention is particularly advantageous if wires or cables are used which have not been previously reaction-annealed.

In one embodiment, the joining material (2) is placed into the main duct (A) under the action of pressure and/or suction, which makes it possible to fill the main duct with joining material homogeneously and without the formation of cavities. Also, the joining material may advantageously be placed into the main duct at the temperature of the joining material and of the stabilizing material forming the main duct, which is above the melting point of the joining material. In this way, the joining material can be introduced into the main duct with constant viscosity without premature solidification. The filling of the main duct with joining material is accomplished by means of at least one filling channel which opens into the main duct and which runs into the wall of the main duct, thereby facilitating the introduction of the joining material into the main duct along the entire length of the carrier.

The super-conductive coil produced by the method of the invention preferably includes a diffusion barrier provided between the super-conductive cables and the carrier and moulded into the joining material thereby preventing joining material from diffusing into the stabilizing material which would lead to a modification in the electrical properties of the materials.

In one embodiment, the carrier of the super-conductive coil of the invention is composed of several parts. This construction of the carrier reduces the eddy current losses in the alternating field, on the one hand, and the introduction of high-strength material, on the other hand, improves the tensile strength of the coil conductor.

Preferably, the super-conductive coil is provided with at least one cooling channel whereby intensive cooling of the carrier interior is achieved. Similarly, the outer surface of the carrier can be provided with cooling tubes mounted thereon.

In a preferred embodiment, the super-conductive coil comprises a coil insulation, and the joining material is a solder, the melting temperature of which lies below the permissible temperature of the coil insulation. Otherwise, another suitable substance for the joining material is a synthetic resin binding agent exhibiting good thermal and electrical conductivity, or permeated with a thermally and electrically conductive powder, and having a hardening temperature which lies below the permissible temperature of the coil insulation. The above-described substances are particularly suitable for use as the joining material since they can be introduced into the main duct of the carrier without damaging the coil insulation.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
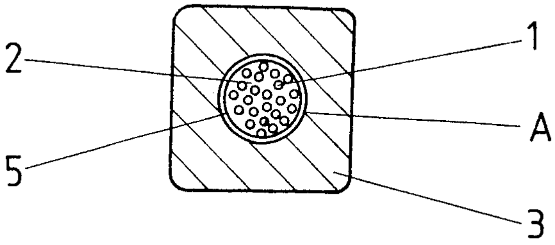
FIGS. 1–5 are schematic cross-sectional views of several embodiments of the super-conductive coil according to the invention.

Referring now to the drawings, wherein like reference numerals designate like or corresponding parts throughout the several views, and more particularly to FIG. 1 thereof, the super-conductive coil of the invention is seen to include several super-conductor wires 1 embedded in a joining material 2. The super-conductor wires 1 consist of an intermetallic A-15 compound, for example $Nb_3Sn$, $V_3GA$ or $V_3Si$. The joining material 2 is thermally and electrically conductive and can be, for example, a solder of the PbSn or SnAg type of compound or a synthetic resin binding agent permeated with metal powder, the hardening temperature of which lies below the permissible limit temperature of the coil insulation. The super-conductor wires 1 are arranged, together with the joining material 2, in a main duct A with circular cross-section, of a carrier 3 with a square cross-section. The carrier 3 consists of electrically and thermally highly conductive material, for example copper or aluminium. A diffusion barrier 5, for example a layer of tantalum, is attached to the inner wall of the main duct A.

Figure 2:
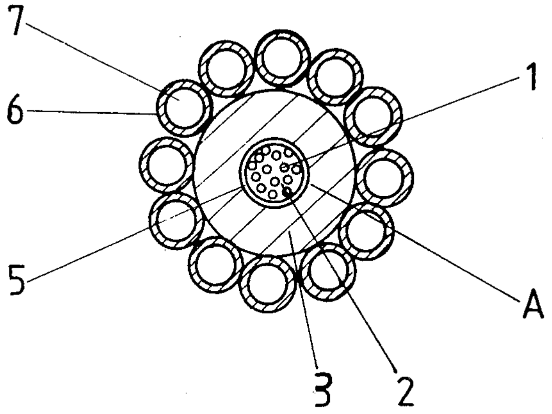

In the illustrative embodiment represented in FIG. 2, the super-conductive individual wires 1 are located in the main duct A of a carrier 3 having circular cross-section. The diffusion barrier 5 is arranged in the identical manner as in the illustrative embodiment according to FIG. 1.

Cooling tubes 6 with cooling channels 7 are attached to the outer surface of the carrier 3.

Figure 3:
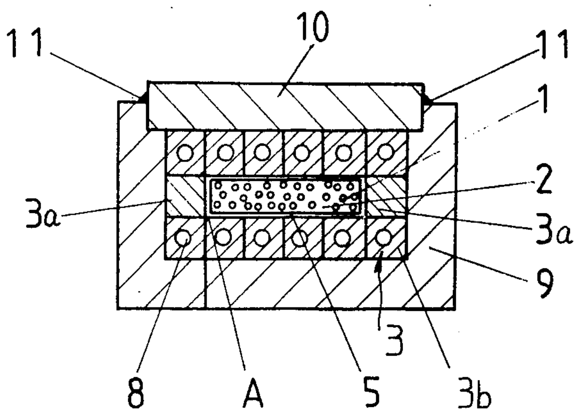

FIG. 3 shows an illustrative embodiment, in which the super-conductor wires 1 are located, together with the joining material 2, in a main duct A, having rectangular cross-section, of the carrier 3. The main duct A is formed by the appropriate arrangement of stabilizing carrier bodies 3*a* and 3*b*. The stabilizing bodies 3*b* are provided with cooling channels 8 of circular cross-section. Between the joining material 2 with super-conductor wires 1 and the stabilizing carrier 3, a diffusion barrier 5 is arranged. The carrier has a square cross-section and is surrounded by a U-shaped steel sheath 9. The U-shaped sheath 9 is welded to a steel cover plate 10 by welding seams 11.

Figure 4:
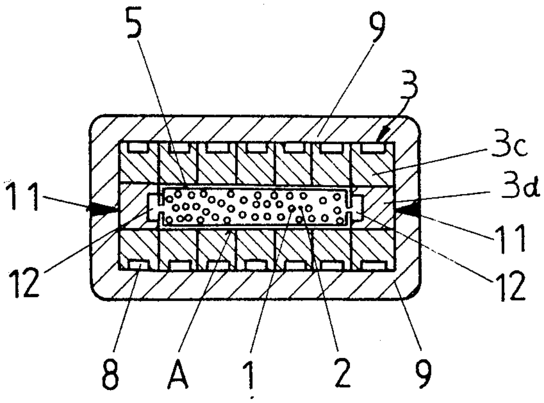

In the illustrative embodiment according to FIG. 4 the rectangular main duct A is formed by stabilizing carrier bodies 3*c*, 3*d*. The stabilizing bodies 3*c*, 3*d* are respectively provided with cooling or filling channels 8 or 12 of rectangular cross-section. The diffusion barrier 5 is provided with openings at the openings of the filling channels 12. The stabilizing bodies 3*c*, 3*d* are surrounded by two U-shaped steel sheath parts 9 which are joined to each other by welding seams 11.

Figure 5:
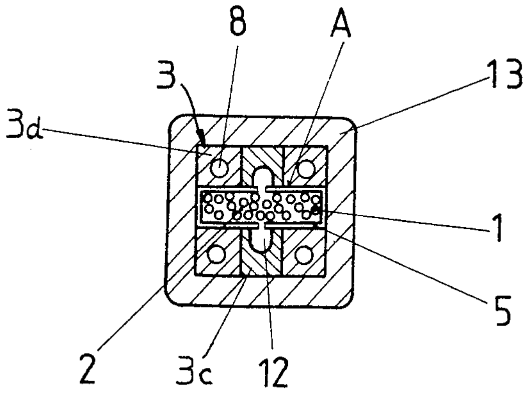

The main duct A of the illustrative embodiment as shown in FIG. 5 is formed by the inner wall of a steel sheath 13 and the stabilizing bodies 3*c*, 3*d*. The stabilizing bodies 3*c*, 3*d* are provided respectively with cooling channels 8 of circular cross-section and with filling channels 12 of U-shaped cross-section. The diffusion barrier 5 arranged between the inner wall of the steel sheath 13, the stabilizing bodies 3*c*, 3*d* and the super-conductor wires 1 with joining material 2, is provided with openings at the openings of the filling channels 12.

The method according to the invention is nextly described in greater detail:

A plurality of super-conductor wires 1 or super-conductor cables, present in braided or twisted form, are loosely inserted or pulled into the main duct A of the carrier 3. The super-conductive wires can be precompressed and partially soldered. After introducing the super-conductor wires 1 or super-conductor cables into the carrier 3 the super-conductor, containing essentially the carrier and the wires, is wound into a coil. Thereafter the super-conductor is insulated, for example by means of polyimide film or by bandaging with epoxy resin-impregnated glass fabric tapes. The main duct A of the carrier 3 is then filled through the filling channels 12 with the joining material 2 which is, for example, a metallic solder with a low melting point, preferably with a melting point between 80° C. and 250° C., or a thermally and electrically conductive synthetic resin binding agent. The joining material 2 is introduced into the preheated coil at a temperature which lies above the melting temperature of the joining material, in such a way that the main duct is evacuated at one end and the joining material is pressed in at the other end under pressure. The joining material can also be introduced through intermediate branches of the main duct A.

The method according to the invention is not limited to the illustrative embodiments represented in the drawings and described hereinabove. It can be used for producing all types of high-intensity field coils and is not limited only to A-15 type super-conductors but can be applied to other super-conductive materials.

Instead of reacted super-conductor wires or reacted cables, non-reacted wires, for example tin/bronze wires with Nb filaments, can be introduced into the main duct A of the carrier 3 in accordance with the method described. The reaction annealing for producing the super-conductor is done before or after the coil is wound. The joining material 2 is introduced into the main duct A of the carrier 3 following the reaction annealing.

In this embodiment, production can take place, up to the reaction annealing, with material which has no brittleness.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method for producing a super-conductive coil to be formed as a coil conductor containing a carrier which essentially consists of a stabilizing material and in which a main duct is provided in which at least one super-conductor cable is to be embedded in a joining material, comprising:

loosely inserting the super-conductor cable into the main duct;

shaping the carrier into the shape of a coil; and completely filling the main duct having the super-conductor cable with the joining material.

2. A method for producing a super-conductive coil to be formed of a coil conductor containing a carrier which essentially consists of a stabilizing material and in which a main duct is provided wherein at least one super-conductor cable is to be embedded in a joining material, comprising:

loosely inserting a cable which can be made super-conductive by means of reaction annealing into the main duct;

shaping the carrier into the shape of a coil;

reaction annealing the cable into a super-conductive cable; and thereafter filling the main duct having the super-conductor cable with the joining material.

3. A method according to claims 1 or 2, wherein said filling step comprises:

forcing the joining material into the main duct under the action of pressure and/or suction.

4. A method according to claims 1 or 2, wherein the joining material is placed into the main duct at a temperature of the joining material and of the stabilizing material forming the main duct, which is above the melting point of the joining material.

5. A method according to claims 1 or 2, wherein the joining material is filled into the main duct through at least one filling channel.

* * * * *